United States Patent [19]

Ohmi

[11] Patent Number: 5,230,721
[45] Date of Patent: Jul. 27, 1993

[54] APPARATUS FOR SUPPLYING ULTRAHIGH PURITY GAS

[76] Inventor: Tadahiyo Ohmi, 1-17-301 Komegabukuro 2-chome, Sendai-shi, Miyagi-ken 980, Japan

[21] Appl. No.: 760,801

[22] Filed: Sep. 9, 1991

Related U.S. Application Data

[63] Continuation of Ser. No. 295,600, Jan. 4, 1989, filed as PCT/JP87/00472, Jul. 6, 1987, abandoned.

[30] Foreign Application Priority Data

Jul. 6, 1986 [JP] Japan .................. 61-158292

[51] Int. Cl.⁵ .................................. B01D 41/00
[52] U.S. Cl. .............................. 55/302; 55/66; 55/208; 55/523
[58] Field of Search ............... 55/16, 158, 66, 96, 55/97, 302, 208, 385.2, 523

[56] References Cited

U.S. PATENT DOCUMENTS

| | | | |
|---|---|---|---|
| 1,874,537 | 8/1932 | Jaycox | 55/208 |
| 3,279,151 | 10/1966 | Kauer et al. | 55/208 |
| 4,032,308 | 6/1977 | Lawson et al. | 55/302 |
| 4,460,466 | 7/1984 | Winter | 210/274 |

FOREIGN PATENT DOCUMENTS

| | | | |
|---|---|---|---|
| 58-131120 | 8/1983 | Japan . | |
| 108334 | 7/1985 | Japan . | |
| 827125 | 7/1981 | U.S.S.R. | 55/97 |
| 1065041 | 12/1981 | United Kingdom | 55/66 |

*Primary Examiner*—Bernard Nozick
*Attorney, Agent, or Firm*—Oblon, Spivak, McClelland, Maier, & Neustadt

[57] ABSTRACT

An apparatus for suppying ultrahigh purity gas to a semiconductor manufacturing unit.

The apparatus includes ceramic filter which is disposed on at least part of a pipe line connected to the gas introduction inlet of the manufacturing unit and a purging mechanism provided between said filter and said manufacturing unit for purging involved impurity gas to the outside of the system.

7 Claims, 12 Drawing Sheets

APPARATUS FOR SUPPLYING ULTRAHIGH PURITY GAS

This application is a continuation of application Ser. No. 07/295,600, filed on Jan. 4, 1989, filed as PCT/JP87/00472, Jul. 6, 1987, now abandoned.

TECHNICAL FIELD

The present invention relates to a system for supplying ultrahigh purity gas to a semiconductor manufacturing unit, and more particularly to a technique for supplying ultrahigh purity gas to the same by arranging a ceramic filter in the vicinity of a final stage of the system.

BACKGROUND ART

Many gases of all kinds are employed presently in semiconductor manufacturing units, etc. .

For example, general gases such as Ar, He, $O_2$, $H_2$, $N_2$ and the like, are employed including various reactive gases such as $Cl_2$, $CCl_4$, $SiH_4$, $SiCl_2$, $H_2$, $SiCl_4$, $BF_3$, $PH_3$, $AsH_3$, $CF_4$, $BCl_3$ and $CH_2F_2$ or the like. These gases are increasingly required to be highly pure with the progress of high integration of LSIs, and ultrahigh purification of raw material gases and of gas supply systems has been brought into realization with recent development of diverse techniques associated therewith. However, in order to prevent any particle produced from raw material gases and a gas supply system from invading into a reaction space of each apparatus, it is general to insert filters into the gas supply system everywhere.

While, these filters, although having to some degree performance to remove fine particles involved in those gases, are likely to gradually release gases absorbed therein in processes of manufacture, cleaning, and assembly, etc., of semiconductor devices. These gases act as sources of contamination. FIG. 6 shows experimental data concerning this problem. FIG. 6(a) is a schematic of an experimental device for measuring degassing of a filter, in which the filter to be examined is mounted on an ultra-high vacuum chamber through a valve and one side of the filter is sealed. The same figures (b), (c), and (d) respectively illustrate results of examination by this device of the rate of degassing of a membrane filter made of Teflon prevailing as a gas filter. Hereupon, the same figure (b) illustrates a change in the degree of vacuum, and the same figures (c) and (d) respectively show measured results by a quadripolar mass filter of changes in partial pressures of gas components having large mass numbers comprising the atmosphere and hydrocarbon in the main. The measurement was effected for 32 hours at room temperature (20° C.) and for 30 hours after heating the filter to 110° C., and thereafter for 12 hours after returning it to room temperature. As evidenced from the same figure (c), the Teflon-made membrane filter releases gases of the components of the atmosphere to a high degree even at room temperature before baking, and further releases the atmospheric components in large quantities also after baking thereof for 30 hours at 110° C. for degassing thereof. The same figure (d) is more important. This shows a result of measurements on the characteristics of degassing of the filter for large mass number hydrocarbons when the filter is baked for 30 hours at 110° C. and thereafter returned to room temperature. As clearly evidenced from the characteristics, some degassing is, as a matter of course, found upon the baking, but even after the degassing there are existent released gases of about from $10^{-9}$ to $10^{-10}$ Torr.

These gases of the hydrocarbons are considered to originate from adsorption of some organic solvents etc. employed in a process of cleaning of the filter.

The reason of such release of abundant gases is that the concerning filter itself is arranged to have a very large effective surface area and the Teflon surface thereof is structured to have innumberable fine holes, whereby those gases are adsorbed and stored on those surfaces, and freed therefrom. With such a filter mounted on a piping system, even if the piping system is constructed with a high purity material, released gases from that filter contaminate high purity gases and as a result those gases so contaminated are fed to a semiconductor manufacturing unit.

For example, when gases such as $H_2O$, etc., mix into Ar gas to be fed to a RF sputtering unit, which serves to make a film from metal such as aluminium, it causes the surface of an Al target being sputtered to be oxidized with ease by $H_2O$ involved in the atmosphere to form $Al_2O_3$ (alumina) on the target surface because it is very active. Since the rate of sputtering for $Al_2O_3$ is reduced compared with Al, the rate of sputtering for the target reduces and thereby the rate of film making decreases sharply. In addition, such $H_2O$ mixed into the Ar gas is also incorporated into the resulting Al film, whereby resistance of wiring of Al is increased to reduce reliability to electromigration. Moreover, when such $H_2O$ is introduced into the RIE unit, active species O and OH are produced in the plasma atmosphere, and when polysilicon is rendered to etching for example, $SiO_2$ is formed on that surface to result in uneven etching with a reduced ratio of selection between the polysilicon so rendered to etching and a underlying $SiO_2$ film.

In view of the drawbacks of the prior techniques, it is an object of the present invention to provide an apparatus capable of supplying ultrahigh purity gas by using a filter in a gas piping system.

SUMMARY OF THE INVENTION

In an apparatus for supplying ultrahigh purity gas to a semiconductor manufacturing unit having a ceramic filter on at least part of a pipe line which serves to supply ultrahigh purity gas to a gas introduction inlet of said manufacturing unit whereby a purging mechanism for purging the concerning gas to the outside is disposed between said manufacturing unit and said ceramifilter.

Figure 1:
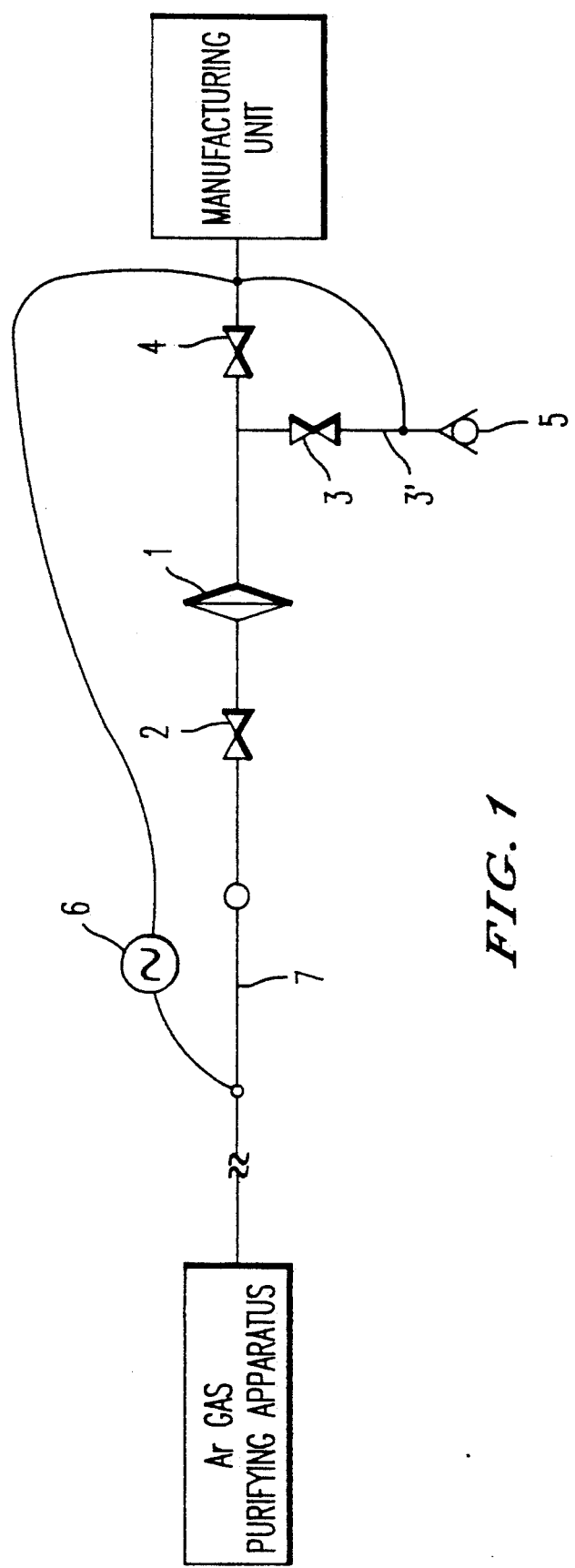
FIG. 1 is a view illustrating the first embodiment of an apparatus for supplying ultrahigh purity gas according to the present invention.

Moreover, in these figures, 1, 301 and 501 are ceramic filters; 3' and 305' are purge lines.

DESCRIPTION OF THE PREFERRED EMBODIMENTS

In what follows, the first embodiment of an apparatus for supplying ultrahigh purity according to the present invention will be described with reference to FIG. 1.

The same figure illustrates a situation of the present invention, in which the apparatus according to the present invention for supplying ultrahigh purity gas is applied to a gas piping system for supplying Ar gas from an Ar purifying apparatus to a semiconductor manufacturing unit (e.g. RF bias sputtering unit). In the figure, designated at 1 is a ceramic filter, and 2, 3 and 4 are respectively valves.

For these valves 3, 4, a two-throw type three-way valve with a reduced dead zone is employed, typically. The apparatus of the present application supplies Ar gas of ultrahigh purity to the manufacturing unit as follows. First, with the valve 4 closed and with the valves 2, 3 opened, the Ar gas is exhausted to the atmosphere via a check valve 5. Thereupon, a current is conducted from a power source 6 to pipe lines 7, 3' to heat the pipe lines for thereby heating gases.

For example, assuming the pipe line 7 to be a stainless pipe line having a diameter of ¼ inch and the flow rate of the Ar gas to be about 1 to 2 l/min. with the current of about 60A being conducted, those gases and the pipe line can be heated substantially to 200° C. It is therefore possible to effectively remove impurity gases adsorbed in the filter by heating those impurity gases and the gas pipe line to about 200° C. and exhausting those gases to the outside of the system after making those gases pass through the ceramic filter 1. After such operation of degassing, the Ar gas may be supplied to the semicouductor manufacturing unit by turning off the power source 6 to return the concerning Ar gas and the piping system to an ordinary temperature and then closing the valve 3 and opening the valve 4. Thus, this invention makes it possible to remove the impurity gas absorbed to the filter in the gas which is supplied to the manufacturing apparatus, by purging the gas passed thorough the filter 1 to the outside without supplying the gas to the manufacturing unit. Therefore, ultrahigh purity gas is securely supplied to the concerning unit which does not incorporate any component of impurity gases of all sorts adsorbed in the filter including atmospheric components at all.

Figure 2A:
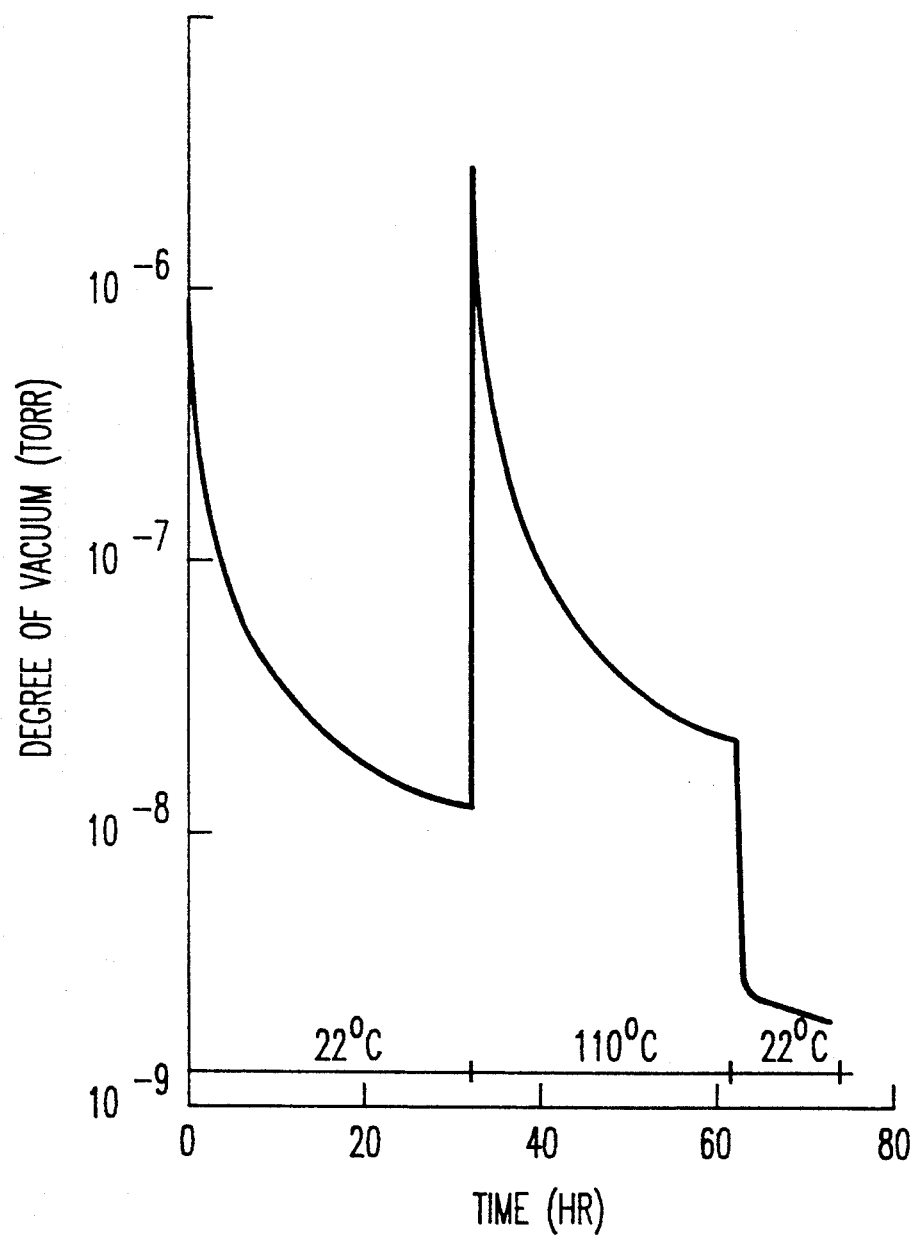
FIGS. 2(a) to 2(c) are experimental data illustrating the characteristics of degassing of a ceramic filter.
Figure 2B:
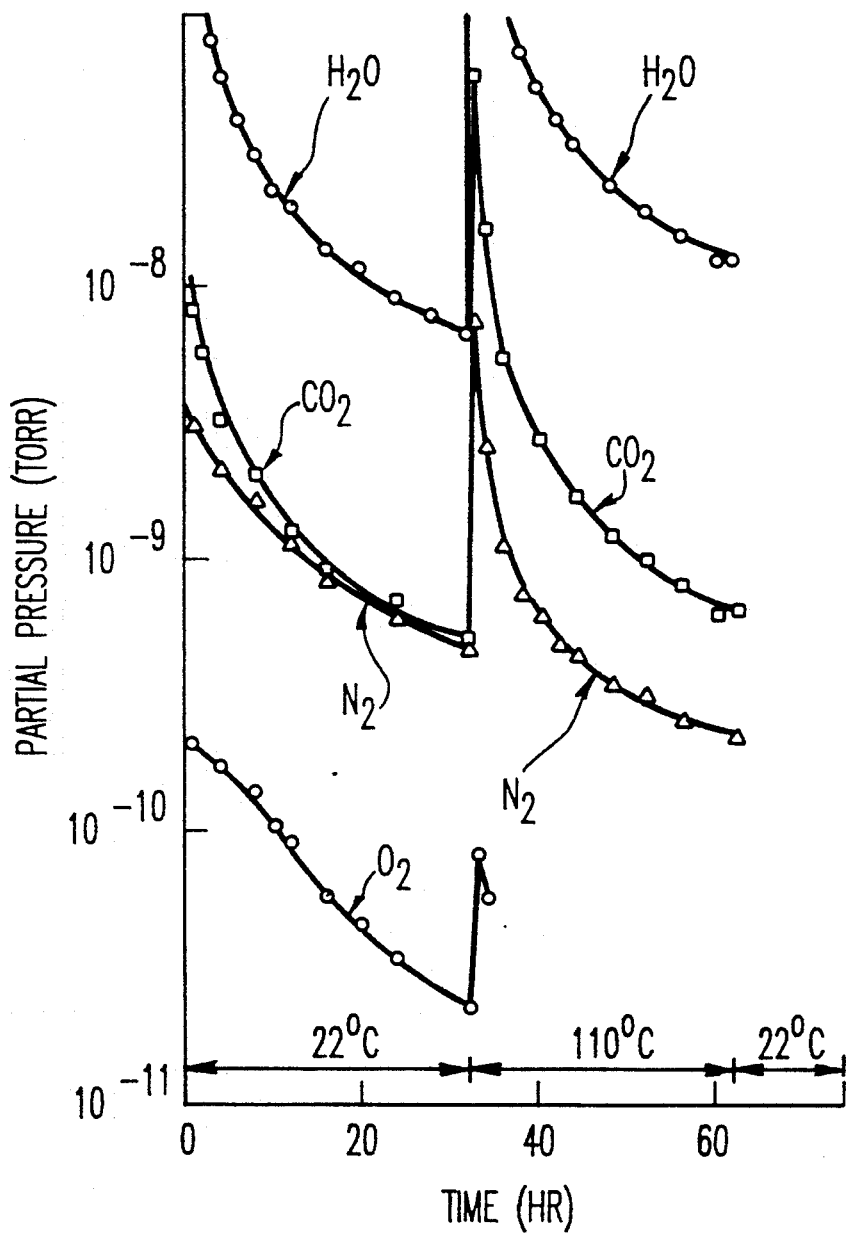
Figure 2C:
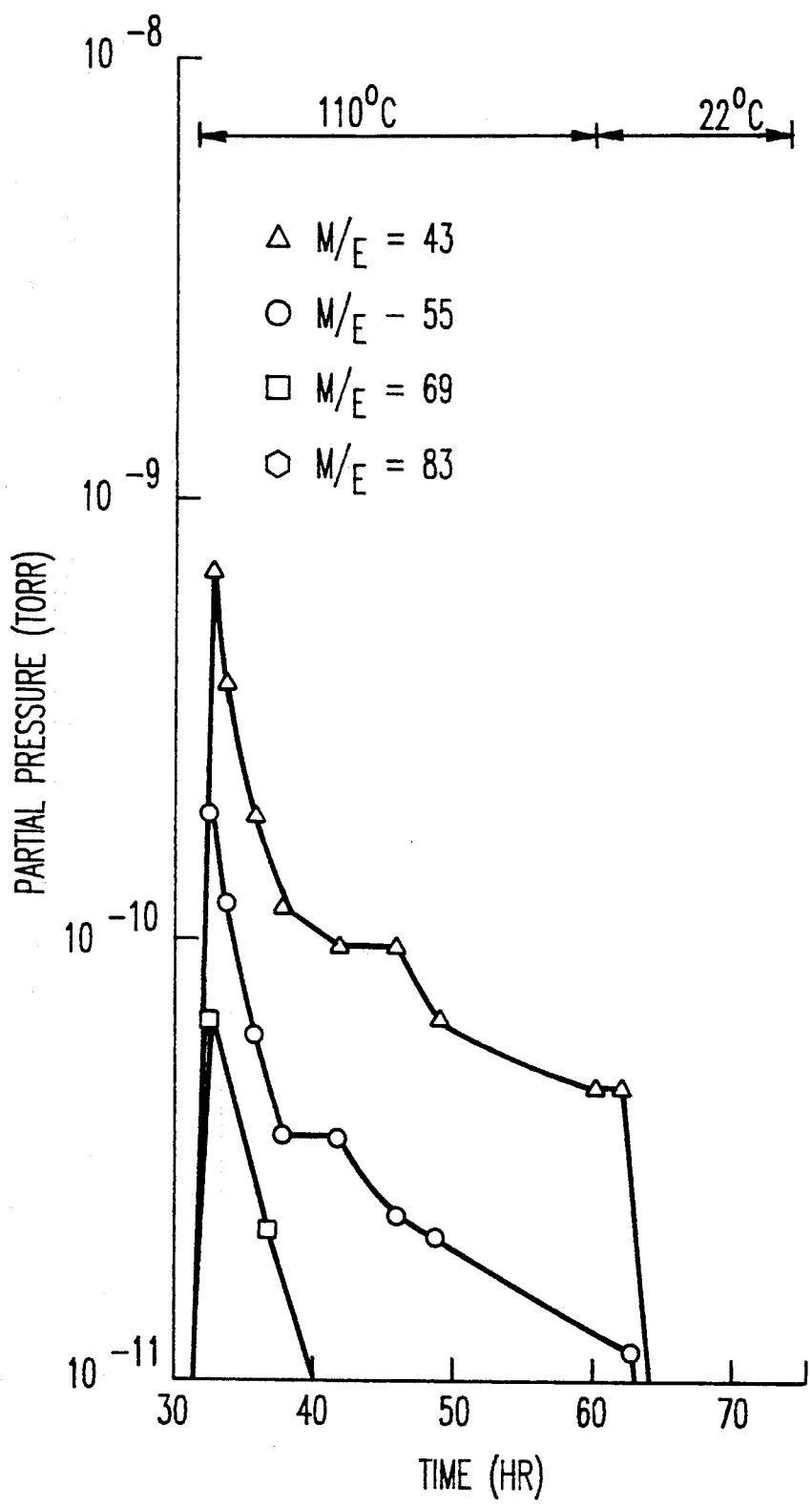
Figure 6A:
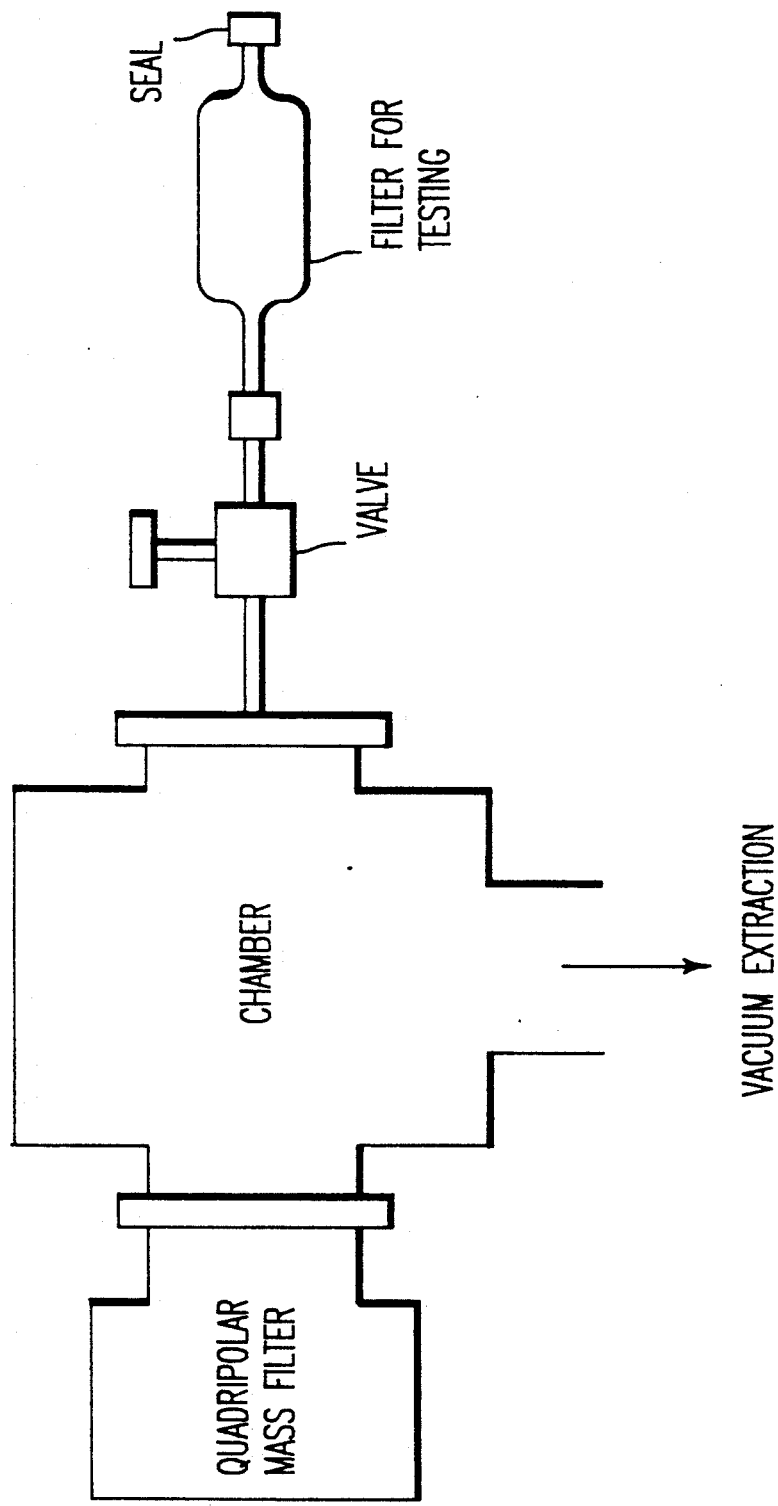
FIGS. 6(a) to (d) are views illustrating a system for measuring the characteristics of degassing of a prior membrane filter and the resulting experimental data, respectively.
Figure 6B:
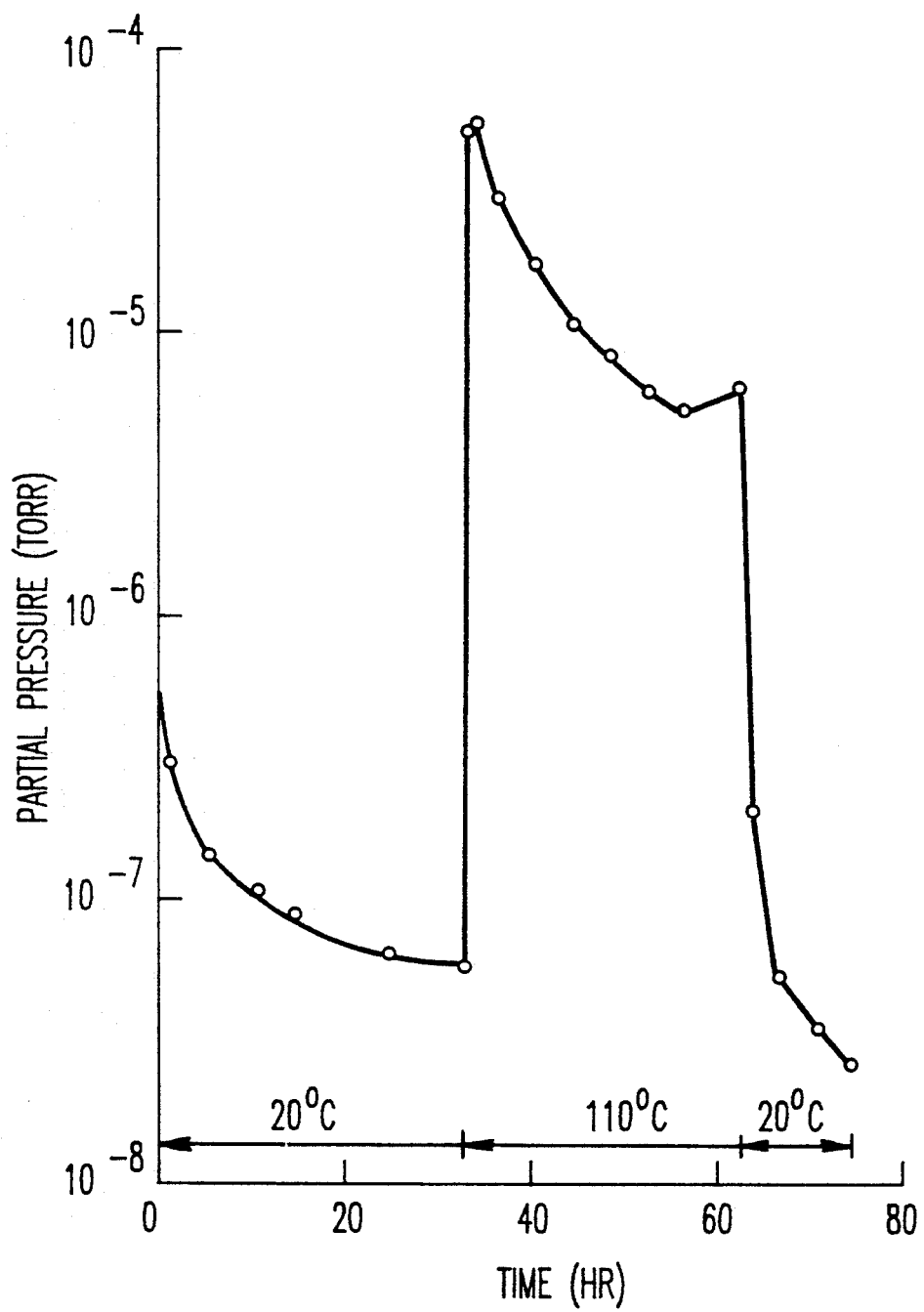
Figure 6C:
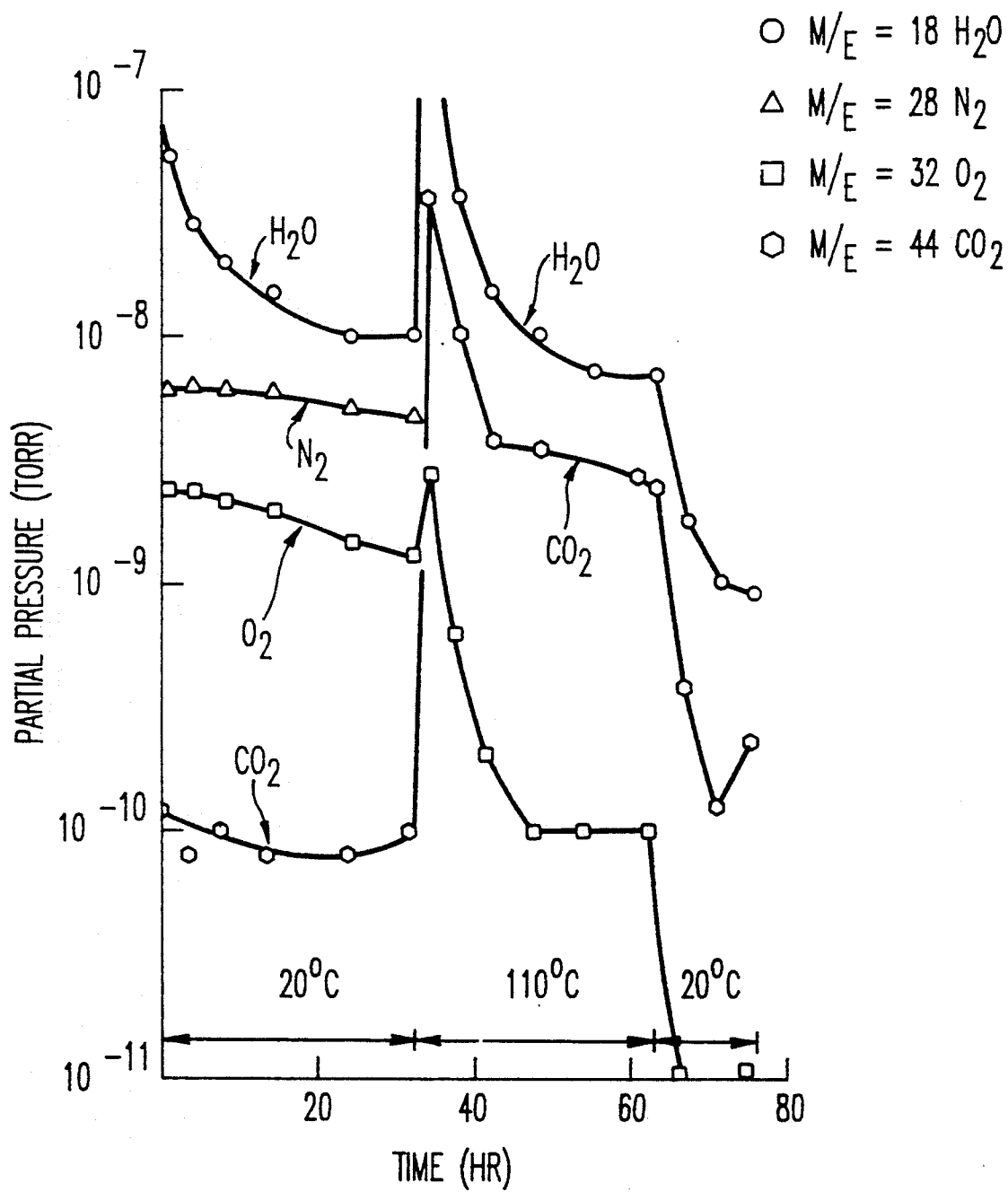
Figure 6D:
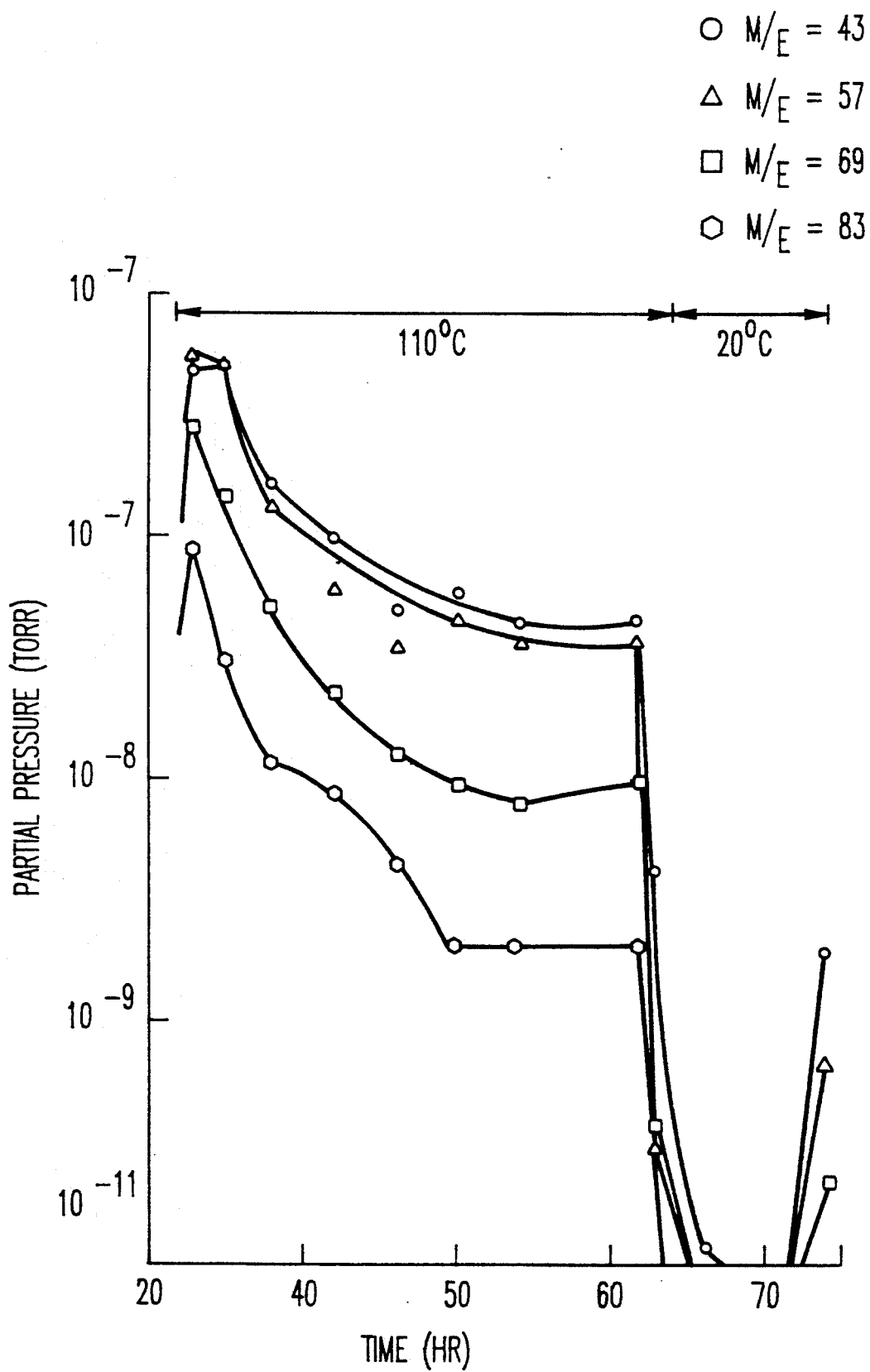

In succession, the reason why the present invention enables ultrahigh purity gas to be supplied will be described. First, the present embodiment employs the ceramic filter whose element is alumina ceramic. This element has substantially uniform fine holes each having diameters of about 0.1 $\mu m$, which acts to capture and remove particles of diameters of 0.01 $\mu$ or more by making use of their Brownian movement. Moreover, such ceramic, although porous, has a smaller effective surface area than that of a prior Teflon membrane and hence has a reduced amount of accumulation of adsorbed gas which can therefore be freed with ease from the surface thereof by raising temperature. In addition, such a prior membrane filter has the limit of heat-resistance of about 120° C., whereas the ceramic filter is bearable against heating exceeding 200° C. provided only a housing has heat-resistance to high temperature to assure baking at sufficiently high temperature. FIGS. 2(a) to (c) illustrate experimental results when the same experiments as those in FIGS. 6(b) to (d) are conducted for such a ceramic filter. As evidenced from FIG. 2(b), partial pressures of atmospheric components yielded by degassing of the ceramic filter at room temperature before baking of that filter are slightly lower tan those yielded by degassing of the membrane filter, but substantially equal to the latter. It is however found that all gas components through the ceramic filter after baking thereof for 30 hours at 110° C. are reduced below the limit of detection.

Furthermore, for the amounts of released gases consisting mainly of large mass hydrocarbons, there are found differences of three figures or more between those cases with the ceramic filter and with the membrane filter. As clearly shown from this experimental data, the ceramic filter can release and remove adsorbed gas more easily by raising temperature than the membrane filter can.

The present embodiment is adapted to heat the filter 1 to about 200° C. and to permit ultrahigh purity gas of 1 to 3 l/min to flow through the piping system for thereby enabling any gas adsorbed in the filter to be released and removed within a very short period of time.

Hereupon, although the present embodiment was described concerning the system for supplying Ar gas to a RF bias sputtering unit, the present invention is applicable to any other gas such as those described initially in the present description including $N_2$, $O_2$ and the like without the limitation to Ar. Moreover, the present invention is applicable also to other units in the same manner as the aforementioned system for supplying Ar.

In addition, although the heating method by conducting a current was described herein as the method of heating a piping system, any other means may be employed including for example a prior method of winding a heater around a pipe line or a method of enclosing a gas supply system in a box and heating the box inclusive of the system, or the like. Moreover, it is preferable to supply the concerning gas to a semiconductor manufacturing unit keeping the piping system in the state thereof wherein the baking of the filter described before now is conducted regularly to remove any adsorbed gas at all times.

Figure 3A:
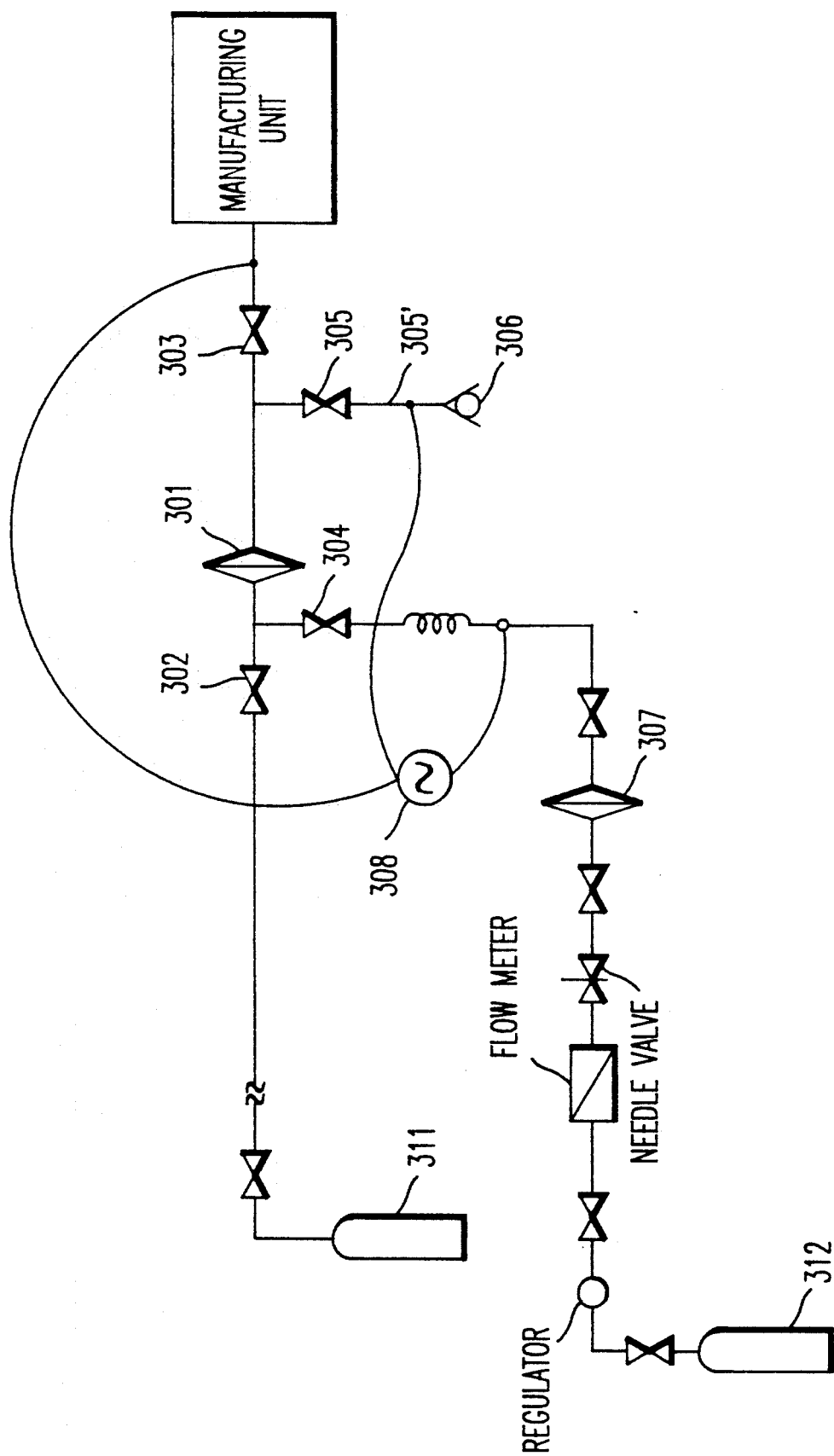
FIGS. 3(a) and 3(b) are views respectively illustrating the second embodiment of the present invention.

FIG. 3(a) is a view of a piping system illustrating a second embodiment of the present invention. This system is conveniently applied to the situation where reactive gases such as $SiH_4$, $PH_3$, $CCl_4$ and the like or special gases are difficult to be exhausted to the atmosphere in bulk. Hereupon, valves 302 and 304, and 303 and 305 are desirable to be two-throw, three-way valves with reduced dead zones, respectively. Upon baking a ceramic filter 301, with the valves 302 and 303 closed and with the valves 304 and 305 opened, $N_2$ gas is supplied from a $N_2$ gas cylinder 312 and purged via a check valve 306 to the outside of the system. The $N_2$ gas from the $N_2$ gas cylinder is, after permitted to pass through a regulator, a flow adjusting valve, and a filter 307, heated to about 200° C. by making use of a current from a power source 308 and fed to a filter. Upon the completion of degassing of the filter for any impurity gas by baking, the valves 304 and 305 are closed and the valves 302 and 303 are opened to supply reactive gas to the manufacturing unit.

Also in the present embodiment, it was possible to completely prevent the concerning gas from being contaminated owing to mixing of any gas released from the filter into the concerning gas.

The present invention however experiences a difficulty that if the valve is changed over immediately after the filter is baked with use of $N_2$ gas to introduce reactive gas into the manufacturing unit, then any fraction of the $N_2$ gas remaining in the pipe line mixes into the reactive gas. For the purpose of avoiding this problem, the following countermeasure may be taken for example: after the $N_2$ gas is purged, the valve 304 is closed and the valve 302 is opened to permit the reactive gas to be purged for some time through the check valve 306 for driving out the fraction of the $N_2$ gas remaining in the system. Thereupon, it is properly required to take some measure for treating the active gas exhausted from the check valve 306 for safety and feeding to an exhaust duct.

Figure 3B:
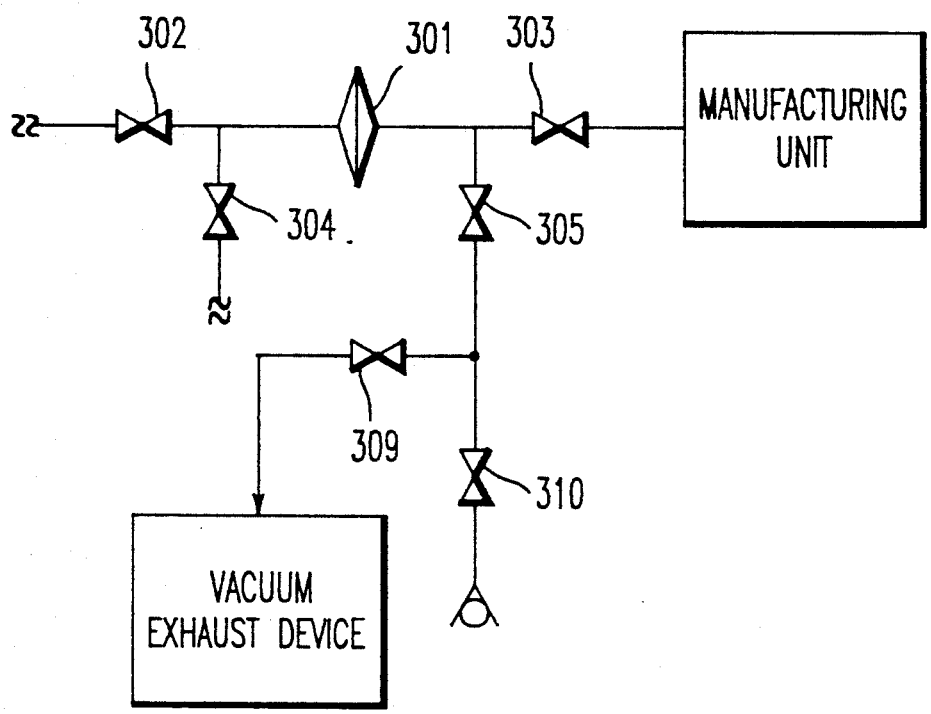

In addition, for the purpose of supplying the concerning gas to the manufacturing unit, the following modification may be taken for example: additional valves 309 and 310 are provided as illustrated in FIG. 3(b), and with the valves 302, 304, 303 and 310 kept closed while with the valves 305 and 309 kept opened after the heated $N_2$ gas has been purged, the piping system is evacuated to remove the remaining $N_2$ gas in the filter and in the piping system, and thereafter the valve 305 is closed while the valves 302 and 303 are opened to assure the aforementioned purpose. Hereupon, the valves 309 and 310 are desirably two-throw three-way valves with a reduced dead zone.

Furthermore, although the second embodiment of the present invention was described by taking, as an example, the case where the reactive gas 311 was supplied to the manufacturing unit the present invention is not limited thereto.

For example, when expensive He gas is employed instead of the reactive gas 311, it is economical to bake the filter with inexpensive $N_2$ gas. Moreover, when, with use of gas cylinders of Ar, He, $N_2$ and the like for example as the reactive gas 311, it is for example required for $O_2$ molecules adsorbed in the filter to be effectively removed, provided a $H_2$ gas cylinder is employed as a gas cylinder for the reactive gas 312, and heated and supplied to the filter in the same arrangement as that shown in FIG. 3(a), it is possible to more rapidly exhaust those $O_2$ molecules to the outside of the system by making use of the effect of substitution of the $H_2$ gas for the $O_2$ gas and the effect of more rapid absorption of the former into the filter than that of the latter.

Here, ceramic such as $Al_2O_3$ is likely to adsorb gases such as $H_2O$, $CO_2$ and the like, and hence these gases flowing with other gases are gradually deposited in and on the ceramic filter, and when they are accumulated to some degree, adsorbed gases being to be released to result in contamination. It is accordingly needed to remove those adsorbed gases by regularly purging the ceramic filter at high temperature. To assure this, the apparatus of supplying ultrahigh purity gas of the present invention is greatly effective.

Figure 4A:
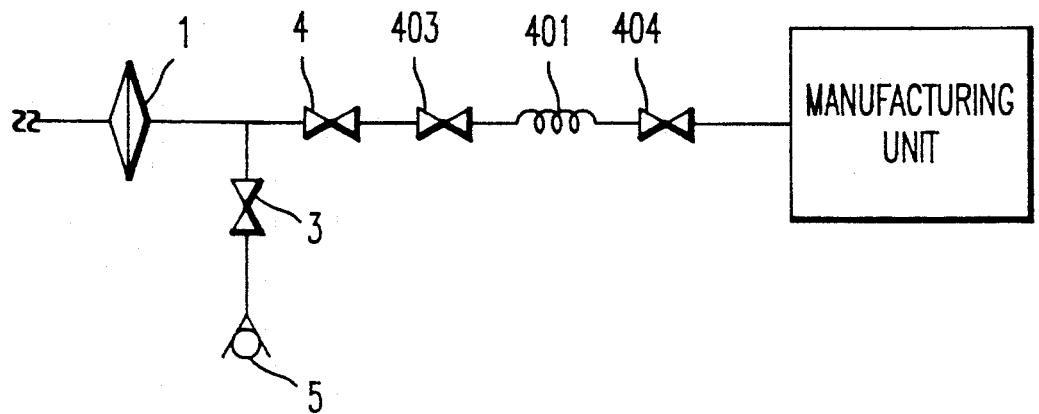
FIGS. 4(a) and 4(b) and FIGS. 5(a) and (b) are views respectively illustrating other embodiments.
Figure 4B:
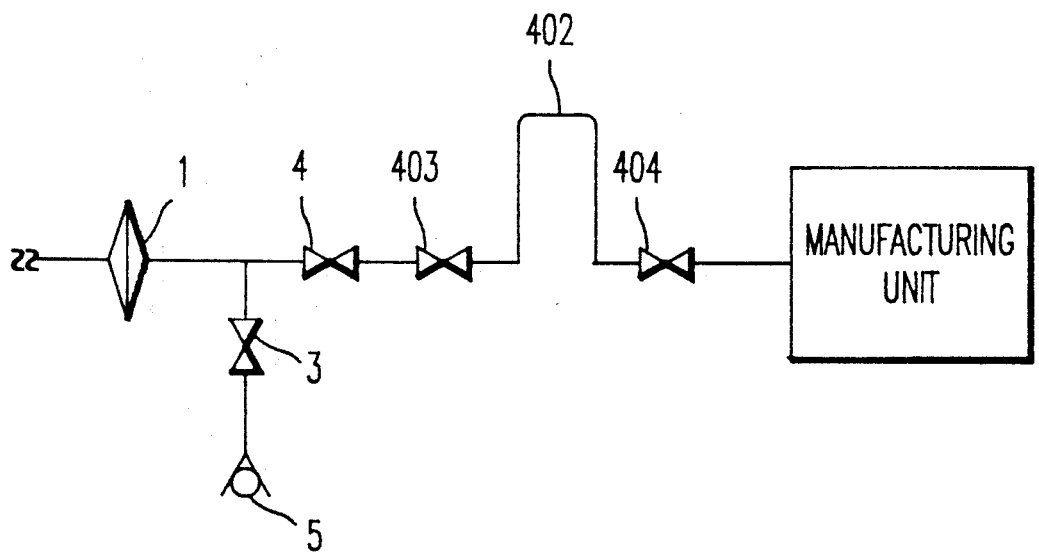

In addition, although piping connection to the manufacturing unit was performed with a straight pipe in the present embodiments shown in FIGS. 1 and 3, it is preferable to permit such piping connection to have flexibility to some extent in some manner such as using a spiral pipe 401 and 1 U-shaped pipe 402 as illustrated in FIGS. 4a and 4b, respectively. Otherwise, it may be preferable for such a pipe line to have a bent part. This is because such situation prevents any leakage of gas through a piping system, which is caused by additional force applied thereto owing to less flexibility of the gas piping system upon maintenance of the concerning apparatus or of the gas piping system.

Moreover, such a flexible arrangement enables the pipe line to be demounted with ease without a fear of mixing of the atmosphere into the piping system when the pipe line is in need of demounting from the system for maintenance of the apparatus.

In connection with this, only a MCG (Metal C-Ring) joint is available at present, which simply allows any leakage less than the limit of detection $(2 \times 10^{10-11} \text{Torr·l/sec})$ to the outside with no dead zone and no particle production, but with slight difficulty: it necessitates a movement of the piping system of about 1 mm for its mounting/demounting.

Accordingly, provided the piping system is provided with any bent part, U-shaped cushion, spiral part, and the like, the pipig system is facilitated in its mounting onto and demounting from the apparatus.

That is, the valves 4, 403 and 404 are closed to permit a MGC joint located between a MGC joint on the side of the apparatus and the valves 4 and 403 to be demounted for demounting the pipe line.

Furthermore, although the first and second embodiments were described only of the case where the filter and the purge line were located directly before the manufacturing apparatus, the present invention is not limited to that situation and permits, as a matter of course, those members to be provided everywhere other than the above-described locations.

Although as described hitherto all the embodiments illustrated in FIGS. 1, 3 and 4 supplied any gas of only one kind to the manufacturing unit, ordinary apparatuses sometimes employ two kinds or more of gases by changing over them in proper or mixing them.

Figure 5A:
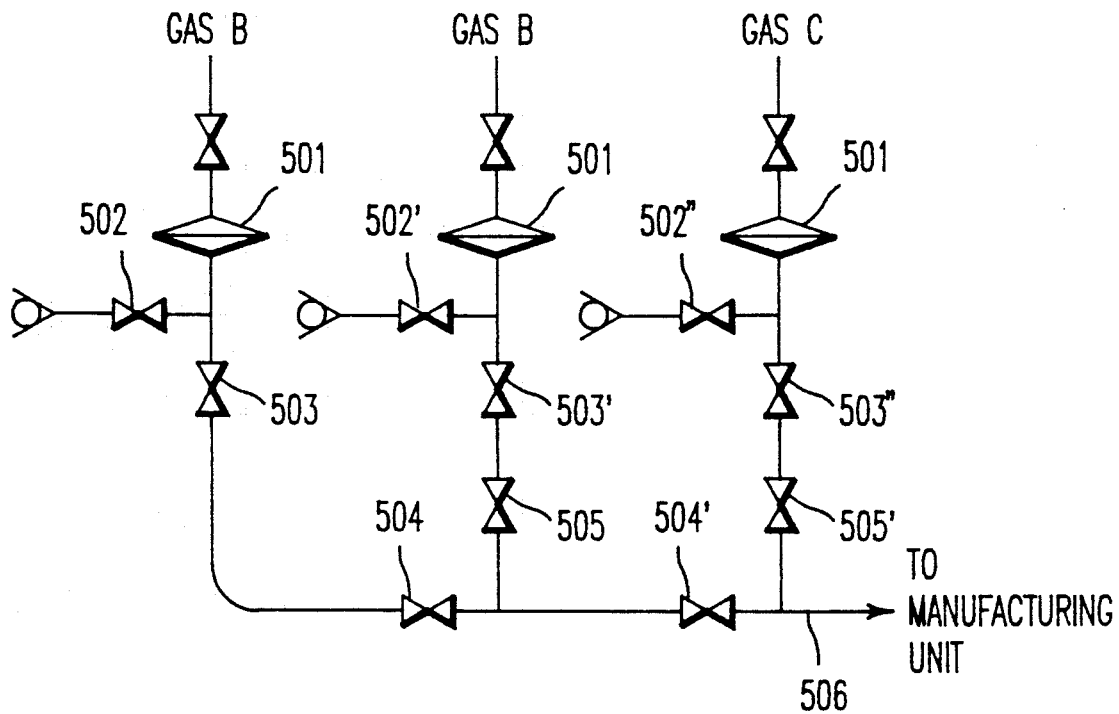

For example, FIG. 5(a) illustrates another embodiment of the present invention wherein two kinds or more of gases (here, three kinds of gases A, B and C are employed in the example) are changed over for use. A system for supplying those gases A, B and C and pipe lines for supplying them to the concerning unit are not shown here, but those illustrated in FIGS. 1 and 3 may be employed for example. Each gas line includes a ceramic filter (501), and a mechanism for exhausting unnecessary gases to the outside by baking is the same as that illustrated in FIG. 1.

Hereupon, the reason why a single filter is not provided on the pipe line 506 serving to supply the concerning gas to the manufacturing unit, but separate filters are provided on the respective gas lines is as follows; the ceramic filter filtrates necessary gases and at the same time it absorbs those gases in rich amount, and thus the common use of only one filter as described above causes other gas components to be mixed into the concerning gas. It is obvious in the present embodiment that such a problem is not produced.

In addition, in order to reduce mutual interference among respective gases, a two-throw three-way valve with a reduced dead zone is commonly employed for both the valves 504 and 505 instead of the use of respective separate valves. This holds likewise for valves 504′ and 505′.

Figure 5B:
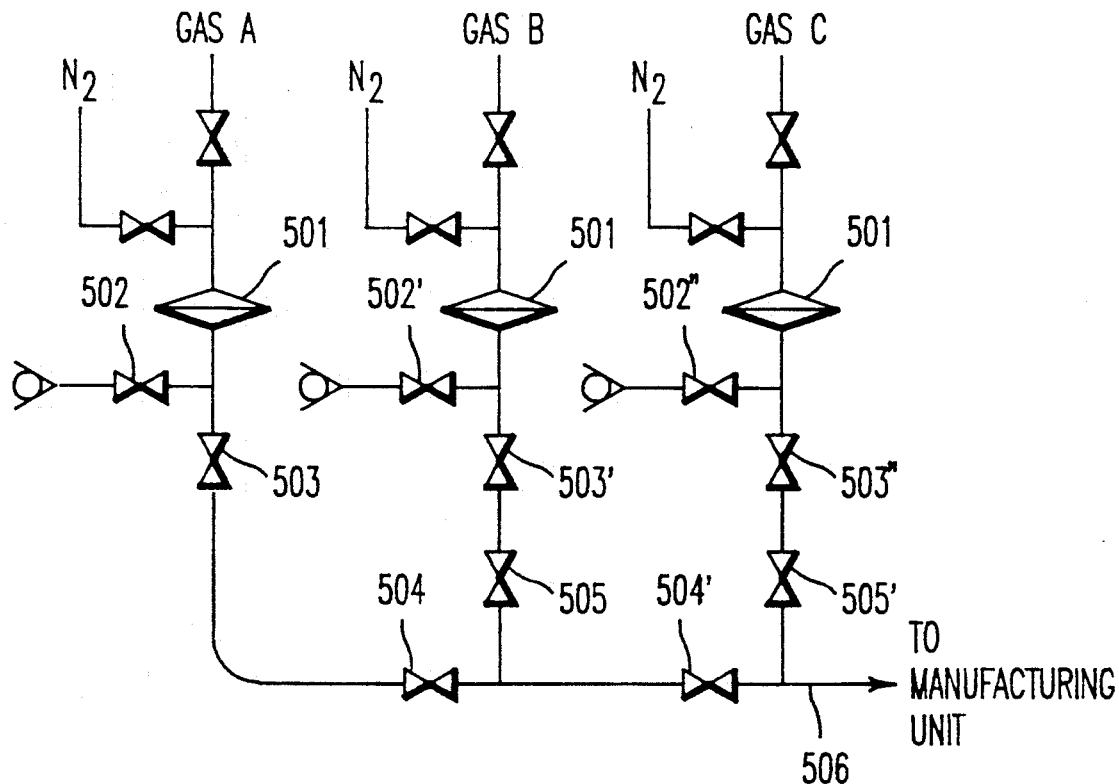

Moreover, FIG. 5(b) illustrates another embodiment wherein a filter is baked with use of another gas (e.g., $N_2$). A method to bake each ceramic filter (501) with the $N_2$ gas is the same as that described in FIG. 3. Also in this case, a two-throw three-way valve with a reduced dead zone may be employed for a couple of the valves 504 and 505 and a couple of the valves 504' and 505'.

Although a power source and wiring particularly for baking are not shown in FIG. 5, those illustrated in FIGS. 1 and 3 may be employed in the same manner.

Still more, when any pipe line is desirous to be prevented from being exposed to the atmosphere upon replacement of any filter or other any component of the system, that is accomplished before and after the concerning filter and thereafter removing that filter.

Furthermore, it is preferable upon removal of any filter to make maintenance of the system easy by incorporating in the system the same structure as that described in FIG. 4 as means to provide flexibility on the pipe lines.

EFFECT OF THE INVENTION

According to the present invention, as described above, it is assured to remove to the full, gases released from the filter for enabling ultrahigh purity gas to be supplied to a semiconductor manufacturing unit.

Although certain preferred embodiments have been shown and described, it should be understood that many changes and modifications may be made therein without departing from the scope of the appended claims:

I claim:

1. A system for supplying ultrahigh purity gas to a semiconductor manufacturing unit comprising:
    a pipe line having one end thereof connected to said unit and another end thereof connected to a gas source;
    a ceramic filter disposed on said pipe line, said ceramic filter including a housing and a ceramic element disposed in said housing;
    a purge gas out line connected to said pipe line between said unit and said ceramic filter;
    valve means for selectively allowing gas passing through said ceramic filter to pass only to said unit in a gas supply mode, said valve means further allowing gas passing through said filter to only pass to said purge gas out line in a purge mode; and
    means for heating a purge gas connected to the pipe line such that when said valve means is in a purge mode, said means for heating heats the purge gas which flows through said ceramic filter.

2. A system according to claim 1, further comprising a vacuum exhaust line, one end thereof connected to said purge gas out line and the other end thereof connected to a vacuum exhaust unit.

3. A system according to claim 1, further comprising a spiral pipe or U-shaped pipe which is disposed between said pipe line and said unit.

4. A system according to claim 1, further comprising a purge gas in line which is connected to said pipe line between said ceramic filter and said gas source.

5. A system according to claim 1, wherein said ceramic element includes a plurality of substantially uniform fine holes which act to capture and remove particles of a diameter of 0.01 $\mu$m or more.

6. A system for supplying ultrahigh purity gas to a semiconductor manufacturing unit through a main pipe line, comprising:
    a plurality of pipe lines with one end thereof connected to said main pipe line and the other end thereof connected to a gas source, respectively;
    a ceramic filter disposed on each of said plurality of pipe lines, each said ceramic filter including a housing and a ceramic element disposed in said housing;
    a purge gas out line connected to each of said plurality of pipe lines between said main line and said ceramic filter; and
    valve means provided for each of said plurality of pipe lines to selectively allow gas passing through said ceramic filters to pass to one of said main pipe line and said purge gas out lines such that in a gas supply mode a gas only passes through said ceramic filters and to said main pipe line and in a gas purge mode a gas only passes through said ceramic filters and to said purge gas out lines.

7. A system according to claim 6, wherein said ceramic element includes a plurality of substantially uniform fine holes which act to capture and remove particles of a diameter of 0.01 $\mu$m or more.

* * * * *

UNITED STATES PATENT AND TRADEMARK OFFICE
CERTIFICATE OF CORRECTION

PATENT NO. : 5,230,721
DATED : July 27, 1993
INVENTOR(S) : Tadahiro Ohmi

It is certified that error appears in the above-indentified patent and that said Letters Patent is hereby corrected as shown below:

On the title page, Item [76],

The inventor's first name is spelled incorrectly, should read:

--Tadahiro--

Signed and Sealed this

Fifteenth Day of March, 1994

Attest:

BRUCE LEHMAN

Attesting Officer    Commissioner of Patents and Trademarks